United States Patent [19]

Katz et al.

[11] 3,887,794

[45] June 3, 1975

[54] DOPPLER SHIFT COMPUTER

[75] Inventors: Louis Katz, Anaheim; Lawrence Wells, Placentia, both of Calif.

[73] Assignee: Electrac, Inc., Anaheim, Calif.

[22] Filed: Oct. 29, 1973

[21] Appl. No.: 408,201

[52] U.S. Cl. ............ 235/151.3; 235/150.25; 343/8; 343/113 DE

[51] Int. Cl. .......................... G06f 15/50; G01s 9/42

[58] Field of Search....... 235/150.2, 150.25, 150.27, 235/151.3, 151.32; 343/8, 106 R, 106 D, 112 C, 112 D, 113 R, 113 DE

[56] References Cited

UNITED STATES PATENTS

| | | | |
|---|---|---|---|
| 3,394,371 | 7/1968 | Mahler | 343/8 X |
| 3,432,856 | 3/1969 | Buell et al. | 235/150.25 X |
| 3,441,934 | 4/1969 | Thaler | 235/151.32 X |
| 3,702,477 | 11/1972 | Brown | 235/150.25 X |
| 3,738,750 | 6/1973 | Kalb et al. | 343/8 X |

*Primary Examiner*—Malcolm A. Morrison
*Assistant Examiner*—Jerry Smith
*Attorney, Agent, or Firm*—Dominick Nardelli

[57] ABSTRACT

A doppler shift computer is disclosed wherein are inputted two separate input carrier frequencies, a high and low carrier frequency (RF) that have been transmitted from a moving transmitter. The receiver frequencies are separated by a signal divider and then the information frequencies are separated from the respective carrier frequencies. Due to the relative motion between the transmitter and the computer, the respective received carrier frequencies have shifted from the respective transmitted frequencies due to doppler effect, and also due to variations in the atmosphere resulting in undesirable frequency error. Therefore, each received carrier frequency includes these frequency components, the transmitted frequency plus or minus the doppler frequency, plus or minus the error frequency. The carrier frequency is known but the doppler and error frequencies are both unknown. In the simplified embodiment, to separate the doppler or the error frequencies therefrom, the received higher carrier frequency is mixed within a first mixer with the output frequency of an oscillator containing a reference frequency plus the higher carrier frequency so that the reference frequency is outputted therefrom. This output frequency from the first mixer is maintained equal to the reference by a phase comparative circuit whose voltage output controls the frequency outputted by a first voltage controlled oscillator at some fixed multiple of the reference frequency plus the higher carrier frequency. A first divider circuit divides the output frequency of the voltage controlled oscillator whereby its output is the reference frequency plus the higher carrier frequency that is inputted to the first mixer. The received lower carrier frequency in the other channel is mixed in a second mixer, also with the output frequency of the voltage controlled oscillator that has been divided by a second divider circuit by a divisor that makes the ratio of the divisors of both divider circuits equal to the ratio of the signal frequencies. This frequency outputted by the second mixer is maintained equal to a fixed fraction of the frequency outputted by a second voltage controlled oscillator. The frequency outputted by the second voltage controlled oscillator is mixed in a controlled manner with one of the frequencies controlling the first voltage controlled oscillator, thus removing the error component therefrom.

6 Claims, 2 Drawing Figures

DOPPLER SHIFT COMPUTER

FIELD OF THE INVENTION

This invention is related to a special purpose computer, more particularly to a computer that can compute the doppler shift of each of two frequencies transmitted from a moving transmitter, determine the frequency error between the two frequencies from a known ratio, allocate the error contribution from each input and subtract that error attributed to the high channel from the high channel doppler output.

BACKGROUND OF THE INVENTION

In celestial navigation, a vessel obtains a fix by sighting in on two celestial bodies. However, when the sky is cloudy, celestial bodies cannot be seen unless the vessel is an airplane flying above the clouds. Therefore, many types of navigation aids have been developed to keep surface vessels moving even in the most adverse visible conditions. One such navigation aid is a satellite moving in a fixed orbit around the earth, wherein the satellite has a transmitter that transmits two RF frequency channels, a high and a low, each channel being composed of a high carrier frequency and a lower data or information frequency. When the carrier frequency travels through space and is observed at a fixed point on earth, the carrier frequencies shift due to the doppler effect and also due to error introduced by, for example, ionospheric conditions of the atmosphere. Since the doppler shift of the transmitted carrier frequency is to be used in obtaining position information, error therein is of concern and noticeable. The ratios of the high carrier frequency to the low carrier frequency, as transmitted, is maintained exactly at, for example, 8 to 3. Since the doppler effect is directly proportional to frequency, the doppler shift of the respective carrier frequencies is also the ratio of 8 to 3. Therefore, the received carrier frequency should always maintain the same ratio, i.e., 8 to 3, irrespective of doppler shift. Received frequencies deviating from this ratio must contain an error component. The error contribution is assumed to be divided between channels on a basis of the inverse of the ratio, i.e., the error contribution of the high to the low channel is at the ratio of 3 to *i* (a valid first order approximation for error caused by ionospheric refraction of frequency). Knowing these facts, one can proceed to calculate the actual error and correct the received carrier frequencies accordingly.

OBJECTS OF THE INVENTION

An object of this invention is to provide a simple, low-cost, special purpose computer for calculating doppler shifts in a frequency.

Another object is to provide a special computer that is capable of calculating doppler shifts in two frequencies travelling from a moving transmitter to a fixed point.

Another object is to provide a special computer which determines the error in the received frequencies due to the transmission medium.

Another object is to provide a special computer wherein frequencies are added, subtracted, multiplied and divided, or any combination of the four operations in such a manner that the error component attributed to the high channel is determined and subtracted from the high channel doppler output.

These and other objects and features of advantages will become more apparent after studying the following detailed description of two embodiments of the invention, together with the appended drawings.

DETAILED DESCRIPTION OF THE DRAWINGS

In this specification the mathematical operation of adding includes both addition and subtraction operations.

Figure 1:
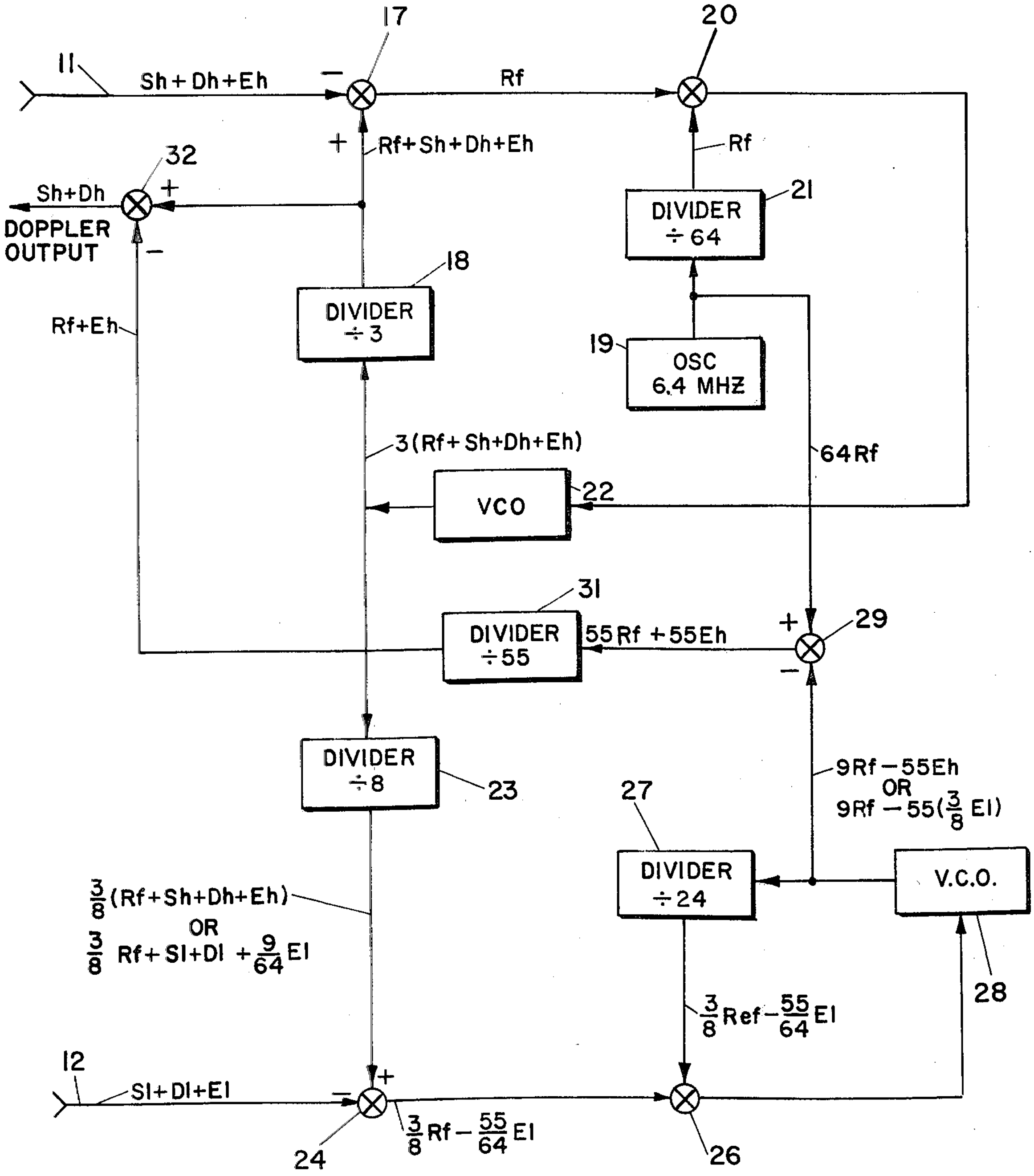
FIG. 1 is a simplified block diagram of the novel computer.

Referring to FIG. 1, two information channels, each including the transmitted carrier frequency, are coupled on respective input lines 11 and 12. The channels consist of a high frequency channel, having a nominal frequency of 32 kilohertz (kHz) and a low frequency channel having a nominal frequency of 12 kilohertz (kHz). Both these frequencies may shift from their nominal values, due to doppler shift and error. Since there are two unknowns in each of the information channels, the two unknowns are capable of being calculated if one assumes that the ratio of the doppler shifts in the respective channels is equal to the ratio of the nominal frequencies, and the ratio of the errors in the respective channels is equal to the inverse of the ratio of the nominal frequencies. Therefore, since the frequency ratio between the high and low is 8 to 3, the ratio of the doppler shifts is assumed to be also 8 to 3; and the ratio of the error shifts is assumed to be equal to three-eighths.

In both figures:

Sh represents the transmitted carrier frequency in the high channel.

Dh represents the doppler shift in the high channel.

Eh represents the error shift in the high channel.

Sl represents transmitted carrier frequency in the low channel.

Dl represents the doppler shift in the low channel.

El represents the error shift in the low channel.

Rf represents the internally generated reference frequency

Therefore, the received frequency in the high channel is equal to these frequency components Sh + Dh + Eh while in the low channel it is equivalent to Sl + Dl + El. The high channel is coupled to a mixer or adder circuit 17, to which is also coupled the output from a divider circuit 18. The output of divider circuit 18 has a frequency value such that the output of mixer circuit 17 is maintained at a reference frequency (Rf) having a value of, for example, 100 kHz. This is accomplished by comparing in a standard comparative or mixer circuit 20 the output frequency of mixer 17 to the output frequency of a stable (reference) oscillator 19. For reasons that will become apparent hereinafter, the output frequency of oscillator 19 is fixed at 6.4 megahertz (MHz) which is divided by 64 by divider circuit 21 to produce 100 kHz. Therefore, when both frequencies are equal and 90° out of phase, the output voltage of the comparator circuit 20 is zero and, depending on which input frequency is higher, the output voltage would become positive or negative. This output voltage is coupled to a voltage controlled oscillator (VCO) 22 to shift its output frequency, which is normally three times the sum of a reference frequency plus the high channel input frequency (3Rf + 3Sh + 3Dh + 3Eh), in a manner to bring the output voltage of the comparator 20 to zero. The next step is to remove the error frequency (Eh) from this frequency.

On the low channel, the information frequency, which includes the signal frequency Sl + Dl + El, and the output frequency of another divider circuit 23 are combined in an adder or mixer 24. Since the VCO 22 produced a frequency equivalent to 3(Rf + Sh + Dh + Eh), the divider circuit 23 divides that frequency by eight so that its output frequency is 3/8 (Rf + Sh + Dh + Eh). Since three-eighths Sh is equal to Sl and three-eighths Dh is assumed to be equal to Dl and 3/8 Eh is assumed to be equal to nine sixty-fourths El, the output frequency of circuit 23 is 3/8 Rf + Sl + Dl + 9/64 El. Thus, the output frequency of adder 24 is 3/8 Rf − 55/64 El. This frequency is coupled to a comparator circuit 26 that compares this frequency with the output frequency from a divider circuit 27 that is a circuit that divides by 24. If both frequencies are the same, and 90° out of phase, no output voltage is produced by the comparator 26, and a VCO 28 does not change its output frequency. If one is higher than the other, the phase departs from 90° and the output voltage changes accordingly and, in turn, the output frequency of the VCO 28 changes its output frequency to cause the output voltage to be restored to zero. The operation of the comparators 20 and 26 and VCO 22 and 28 are standard in the art. Since the divider circuit 27 divides the output frequency of VCO 28 by 24, the output frequency of the VCO is 9 Rf − 55 (3/8 El) or 9 Rf − 55 Eh. This frequency from the VCO 28 is coupled to a mixer 29 wherein a frequency equal to 64 Rf is also applied. The output frequency of VCO 28 is subtracted therefrom to produce on the output of mixer 29 a frequency equal to 55Rf + 55 Eh. Now, by dividing in circuit 31 the output frequency of mixer 29 by 55, the output frequency Rf plus Eh is produced. This frequency is coupled to a mixer 32 together with the output of divider 18 so that Rf and Eh are subtracted to produce on the output of mixer 32 the high signal Sh together with its doppler shift Dh. The doppler shift indicates how fast the object sending the information signal is moving towards or away from the observation station.

Figure 2:
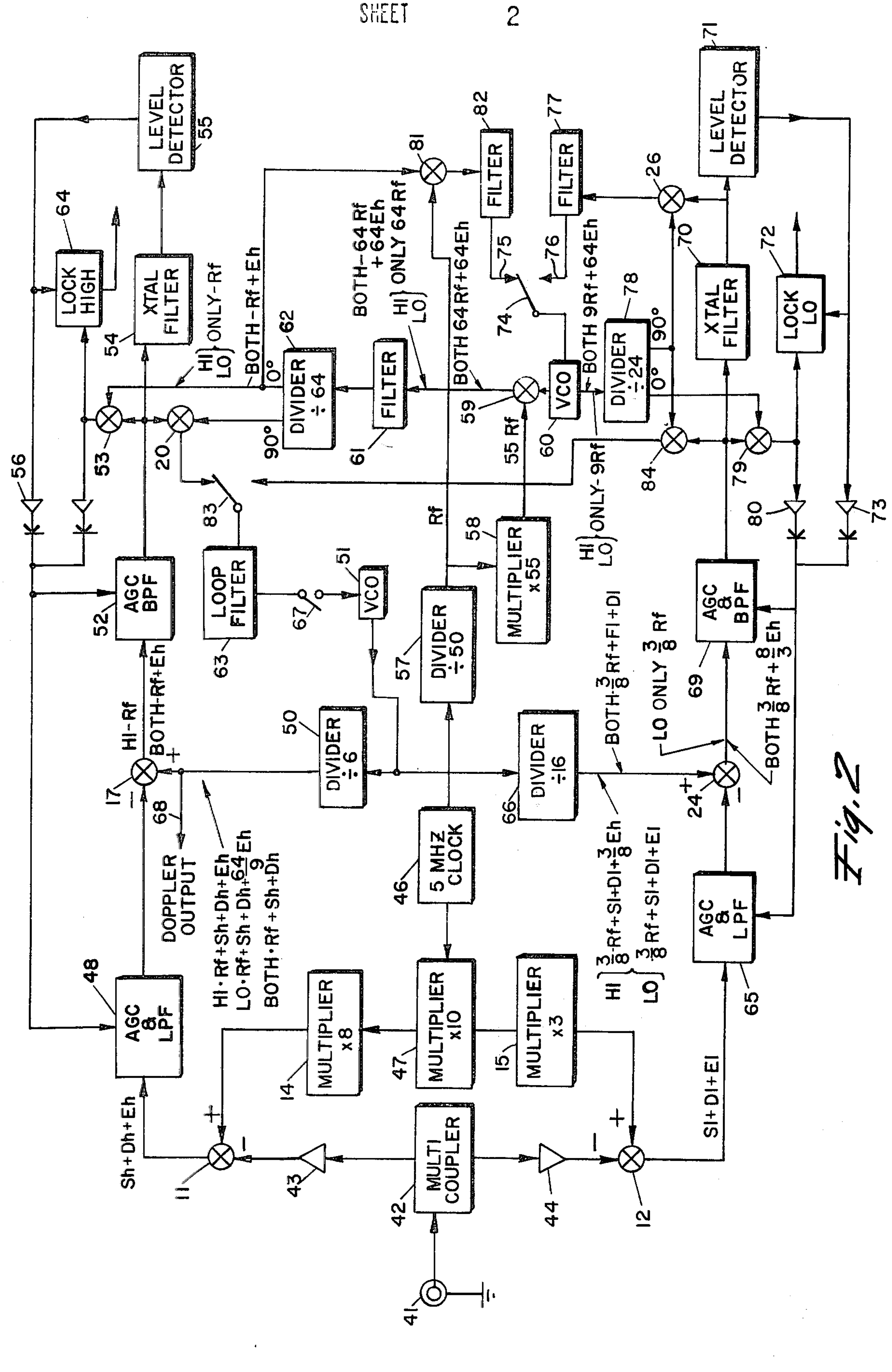
FIG. 2 is a detailed block diagram of a more improved form of the novel computer.

Having described one embodiment of the invention, FIG. 2 shows a variation of the invention, also by block diagram. High and low channel carrier frequencies from a moving transmitter are picked up by an antenna 41 and the channels are split by a standard multicoupler 42 to a high (400 MHz) band amplifier 43, and to a low (150 MHz) band amplifier 44. The output of amplifier 43 is coupled to the mixer 11 wherein is added a stabilized frequency of 400 MHz which is obtained from a standard 5 MHz clock 46, whose output has been multiplied by 10 in a multiplier circuit 47 and again by 8 in a multiplier 14. The output of the adder 11 is coupled through an automatic gain controller (AGC) and low pass filter (LPF) 48 to the adder 17 to which is also coupled the output of a divider circuit 50 that divides by 6. A divide by 6 divider circuit is preferred as it is more easily and economically fabricated than the odd number (3) divider circuit 18 and provides a symmetrical square wave output. Therefore, during normal operations, the output frequency of a VCO 51 should be approximately twice the output frequency of VCO 22. At the start of operation, the VCO 51 is swept through a frequency band. When the frequency on the output of mixer 17 is equal to Rf, a crystal filter 54 centered at Rf passes a signal to a level detector 55 since an AGC and Bandpass Filter (BPF) 52 couples the Rf thereto. In turn the detector 55 produces a signal to lock circuit 64 to cause switch 67 to close so that the output of a loop filter 63 controls the VCO 51 to maintain the outputted frequency from the mixer 17, equal to Rf. The output signal from the detector 55 is also amplified in amplifier 56 so that the output stabilizes both AGC 48 and 52. In order that the frequency on an output 68 from divider 50 is to be equal to Rf + Sh + Dh, (no error term) the output frequency of the adder 17 should be Rf + Eh. The frequency Eh is small in comparison with frequency Rf.

The matter of maintaining this outputted frequency equal to Rf + Eh will now be explained. The clock frequency 5 MHz from clock 46 is divided by 50, by divider 57, producing on its output, Rf. This is coupled to a multiplier 58 and multiplied by 55 to produce on its output, 55 Rf, which is coupled to a mixer 59 together with the output of a VCO 60. The VCO 60 has on its output during normal both locked operations a frequency equal to 9 Rf + 64 Eh so that the frequency on the output of mixer 59 is equal to 64 Rf + 64 Eh. This frequency is filtered in a band pass filter 61 and then divided by 64 by divider 62 to produce on both its outputs a frequency equal to Rf + Eh, with one being 90° out of phase with the other for reasons that will be apparent hereinafter.

The manner VCO 60 produces a frequency equal to 9 Rf + 64 Eh will now be explained, together with the low frequency channel. The outputs of amplifier 44 and a multiplier 15 are coupled to the mixer 12, and generates an output frequency which is equal to Sl + Dl + El. This is coupled to another automatic gain control and filter circuit 65, and to the mixer 24. The other input to the mixer 24 is obtained from the divider 66 which divides by 16 instead of 8, as divider 23, to maintain the 8/3rds carrier ratio. The output frequency of divider 66 is three-eighths the output frequency of the divider 50 or substantially 3/8 (Rf + Sh + Dh) or 3/8 Rf + Sl + Dl, at normal both locked operation. Therefore, the output frequency of the mixer 24 is substantially 3/8 Rf + El, or 3/8 Rf + 8/3 Eh. That is coupled to another AGC and BPF 69 and to a crystal filter 70 which only passes a signal when its input frequency is substantially close to 3/8 Rf. The output of the filter 70 is coupled to another level detector 71 and, in turn, to a lock circuit 72 and to an amplifier 73 to control, in turn, the automatic gain control circuits 65 and 69. When both lock circuits 64 and 72 are activated, a switch 74 makes contact with contact 76 in a standard manner so that the output of a loop filter 77 controls the VCO 60. To maintain the system locked, both inputs of the comparator circuit 26 should have the frequencies 3/8 Rf + 8/3 Eh thereon so that the VCO 60 outputs the frequency 9 Rf + 64 Eh which, when divided by 24, by divider 78, produces a frequency 3/8 Rf + 8/3 Eh on one of the inputs to the comparator 26. The other input to the comparator 26 attains its frequency 3/8 Rf + 8/3 Eh from filter 70. When VCO 60 is locked to frequency 9 Rf + 64 Eh, to maintain the low frequency channel lock, the other output of divider 78 that is 90° out of phase from its first output is coupled to a correlation detector 79 together with the output of the automatic gain control circuit 69. Since the phase locked loop maintains the phase relationship of the 90° output of divider 78 and the output of AGC and BPF 69 at 90° as previously explained, the 0° output of divider 78 will be in phase with the output of AGC and BPF 69. This arrangement will cause a dc voltage component to be generated at the output of mixer 79, which is proportional to signal level at the output of AGC and BPF 69. This voltage maintains lock circuit 72 locked and also is used to control the gain of circuits 65 and 69 through amplifier 80. A correlation detector 53 is used in the high frequency channel to accomplish the same result in the high channel as detector 79 accomplishes in the low channel.

During normal operations, both lock circuits 64 and 72 are locked, indicating that the outfilter 54 is at substantially Rf frequency and the output of the crystal filter 70 is substantially at $3/8$Rf frequency. There may be times when only the high channel is locked, and not the low channel. Then the logic circuit, not shown, causes switch 74 to make contact with a contact 75 and the output of the divider 62 is only equal to Rf becuase one of its inputs is coupled to the comparator 81 together with the output of divider 57. Since the frequency on this output is equal to Rf, then the frequency outputted by divider 62 should be equal to Rf to cause no signal to be outputted by the comparator 81, and in turn, the filter 82, to maintain the output frequency of VCO at 9 Rf. Again, with only lock circuit 64 locked, a swtich 83 is maintained in its state as shown in FIG. 2. The output frequency on output line 68, in this condition, is equal to Rf + Sh + Dh + Eh. Then as soon as the low frequency locks, the out putted frequency would include only one unknown which would be the Dh frequency.

There are times when only the low channel may lock before a high channel. Then the locking circuit causes switch 83 to assume its alternate state than shown in FIG. 2 so that the output of a comparor 84 is coupled to filter 63. Again, switch 67 is also closed. Switch 74 remains in the state as shown, and the output of the divider 66 should have a frequency equal to $3/8$ Rf + Sl + Dl + El, and the output frequency of mixer 24 is $3/8$ Rf. Both inputs to comparator 84 should have frequency $3/8$ Rf coupled thereto so that no signal appears on the output of comparator 84. Thus, to maintain this nulled condition, VCO 51 should produce a frequency equal to 6 Rf + 6 Sh + 6 Dh + 128/3 Eh. So that when it is divided by 16 by divider 66, the frequency is $3/8$ Rf + $3/8$ Sh + $3/8$ Dh + 8/3 Eh or $3/8$ Rf + Sl + Dl + El.

Thus is disclosed a computer that has primarily divide circuits to compute two unknown frequencies contained in two input frequency channels. Although the preferred embodiments have been disclosed, the invention is not considered limited thereto, but includes all embodiments falling within the scope of the claims.

We claim:

1. A computer for calculating the amount the frequency in first and second RF channels has shifted while being transmitted from a first point to a second point wherein each received frequency at the second point is the sum of the transmitted frequency plus the doppler shift frequency plus the error shift frequency and the two transmitted frequencies are at a fixed ratio to each other, said computer comprising:

a first and a second adder for adding at least two frequencies inputted therein and outputting the sum, first means for coupling the received frequency of said first channel to said first adder, second means including a first voltage controlled oscillator and a first divider circuit for producing a first frequency that includes a reference frequency plus at least the transmitted and doppler frequencies of said one channel and for coupling said first frequency to said first adder so that at least the reference frequency is outputted therefrom, thrid means of producing a second frequency that is substantially equal to the outputted frequency from said first adder fourth means for comparing said second frequency and the outputted frequency from said first adder to produce a first voltage that is related to the phase difference between the frequencies, said first voltage controlled oscillator being responsive to said first voltage to control its output frequency to maintain said second frequency and said first adder outputted frequency equal to each other and its output frequency being a multiple of said first frequency, said first divider circuit being disposed between said first voltage controlled oscillator and said first adder, fifth means for coupling the frequency of the second channel to said second adder, a second divider for dividing the output frequency of said first voltage controlled oscillator and producing a third frequency wherein the ratio of said first frequency to said third frequency is the same as the ratio of said transmitted frequencies and for coupling said third frequency to said second adder, said second adder outputting a fourth frequency that includes the reference frequency multiplied by said ratio and a fraction of the value of the error frequency of said second channel, sixth means including a second voltage controlled oscillator and a third divider having its input coupled to the output of said second oscillator for producing a fifth frequency that is substantially equal to said fourth frequency, seventh means for comparing said fourth and fifth frequencies to produce a second voltage that is related to the phase difference of the frequencies and is coupled to the input of said second oscillator, said second voltage controlled oscillator being responsive to said second voltage to control its output frequency to maintain said fifth frequency equal to said fourth frequency and the output frequency of said second oscillator being a fixed multiple of said fourth frequency, and eighth means for coupling the output frequency of said second oscillator to the output frequency of said first oscillator so that the error frequency shift is removed from the outputted frequency of said first divider.

2. The computer of claim 1 wherein:

the transmitted frequency on said second channel is lower than the transmitted frequency on said first channel, said fourth frequency is further limited to having said fraction error frequency of said second channel equal to the square of said ratio minus one, said third divider circuit divides the output of said second oscillator by a first integer so that the output frequency of said second oscillator is equal to a second integer multiple of said reference frequency minus a third integer multiple of the error frequency of said first channel, said third means includes a fixed oscillator that produces an output frequency that is a fourth integer multiple of said reference frequency, said eighth means includes a third adder to which the output frequency of said fixed oscillator and the output frequency of said second oscillator are coupled for subtracting the second mentioned output frequency from said first mentioned, and said first, second, third and fourth integers are chosen so that the output frequency of said third adder is equal to said third integer multiple of both the reference frequency plus the error frequency of said first channel, said eighth means also includes a fourth divider circuit for dividing the output frequency of said third adder by said third integer, said first divider is limited so that its output frequency is substantially equal to the received frequency of said first channel plus the reference frequency, said eighth means includes a fourth adder to which is coupled the output frequency of said first divider and the output frequency of said fourth divider so that its output frequency is equal to the transmitted frequency plus the doppler frequency of said first channel.

3. The computer of claim 2 wherein said third means also includes a fifth divider circuit that divides the output frequency of said fixed oscillator by said fourth integer and couples the result to said fourth means.

4. The computer of claim 3 wherein:

the ratio of the frequency of said first channel to the frequency of the second channel is 8 to 3;

said first divider circuit divides the output frequency of said first oscillator by 3;

said second divider circuit divides the output frequency of said first oscillator by 8;

said third divider circuit divides the output frequency of said second oscillator by 24;

said fourth divider circuit divides the output frequency of said third adder by 55;

said fixed oscillator produces a frequency that is 64 times larger than said reference frequency.

5. The computer of claim 1 wherein:

the transmitted frequency on said second channel is lower than the transmitted frequency on said first channel, said first frequency outputted by said first divider circuit consists of the sum of the reference, the transmitted and the doppler frequencies of said first channel;

said output frequency of said first adder consists of the sum of the reference and error frequencies of said first channel;

said fourth frequency consists of the sum of the reference times said ratio and the error of said first channel times the inverse of the ratio;

said second oscillator producing a frequency that is the sum of a first integer times the reference and of a second integer times the error frequency of said first channel;

said third and eighth means in combination include:

a fixed oscillator means for producing a frequency that is a third integer times the reference frequency and said third integer is equal to the difference between said second and first integers;

a third adder to which are coupled the output frequency of said second oscillator and the third integer times the reference frequency to produce a sixth frequency that is equal to the second integer times the sum of both the reference and the error frequency of said first channel, a fourth divider for dividing said sixth frequency by said second integer to produce said second frequency.

6. The computer of claim 5 wherein said first and second means each of which includes:

an antenna for receiving carrier frequencies that include the transmitted frequencies of said first and second channels respectively and the carrier frequencies therein are also related to said ratio;

a multi-coupler means for separating the frequencies to the respective channel;

a first carrier frequency remover coupled to said multi-coupler means;

said fixed oscillator means also produces the carrier frequencies of both channel and couples each carrier frequency to a respective carrier frequency remover to produce said received frequencies.

* * * * *